United States Patent [19]

Downhower, Jr. et al.

[11] 4,442,480
[45] Apr. 10, 1984

[54] PROTECTIVE CIRCUIT FOR THYRISTOR CONTROLLED SYSTEMS AND THYRISTOR CONVERTER EMBODYING SUCH PROTECTIVE CIRCUIT

[75] Inventors: Francis H. Downhower, Jr., Alden; Paul T. Finlayson, Depew, both of N.Y.

[73] Assignee: The United States of America as represented by the U.S. Department of Energy, Washington, D.C.

[21] Appl. No.: 351,808

[22] Filed: Feb. 24, 1982

[51] Int. Cl.³ .............................................. H02M 1/18
[52] U.S. Cl. ..................................... 363/57; 340/645; 363/68

[58] Field of Search ................... 363/57, 68; 340/645; 361/2, 91; 307/252 L, 252 Q

[56] References Cited

U.S. PATENT DOCUMENTS 3,593,038  7/1971  Hylten-Cavallius et al. ... 307/252 L
3,623,054 11/1971  Wuthrich ............................ 340/645

Primary Examiner—William H. Beha, Jr.
Attorney, Agent, or Firm—C. M. Lorin

[57] ABSTRACT

A snubber circuit coupled across each thyristor to be gated in a chain of thyristors determines the critical output of a NOR LATCH whenever one snubber circuit could not be charged and discharged under normal gating conditions because of a short failure.

3 Claims, 3 Drawing Figures

PROTECTIVE CIRCUIT FOR THYRISTOR CONTROLLED SYSTEMS AND THYRISTOR CONVERTER EMBODYING SUCH PROTECTIVE CIRCUIT

BACKGROUND OF THE INVENTION

The present invention relates to thyristor protection in general, and more particularly to a circuit for the detection of individual thyristor failure.

In an array of thyristors it is important to detect without delay if any of the thyristors do not operate properly, in order to be able to shut down the entire system before the failure of one thyristor endangers the operation of the others, or puts into jeopardy the overall system operation.

In this regard, it is desirable to be able to sense thyristor failure individually, although it can be sufficient to know that such failure has occurred without the necessity of identifying immediately which thyristor is defective. Such an approach has the advantage of simplicity, reliability and uniformity.

The present invention is particularly applicable to the detection of a thyristor failure due to a short in the device. A thyristor may fail to turn ON and remain OFF because of misfiring under gating control, or because it inherently is no longer capable of being turned ON. This is called thyristor failure in the open mode. A thyristor may also fail because of overvoltage and the occurrence of an arc over the device. The thyristor remains shorted across its main electrodes, independently of any gating or communication condition. In such case the thyristor is said to have failed in the shorted mode. The present invention is with regard to the detection of thyristor failure in the shorted mode. The invention is particularly applicable to a stack of thyristor sharing in common a relatively high voltage. It is important in such instance that failure of one thyristor be detected and that precautionary measures, such as a shut-down, be immediately taken before the entire voltage exceeds the rating of the other thyristors in the stack, in which situation each thyristor could be damaged one after the other.

SUMMARY OF THE INVENTION

The present invention resides in providing each thyristor of a stack of thyristors sharing a common voltage in series to one another with individual capacitor means for charging up to a voltage related to the voltage normally applied to each thyristor of the stack, with means for sensing any discharge of such individual capacitor when the associated thyristor is being turned ON, and with means for detecting the absence of any discharge by said sensing means, in regard to any thyristor of said stack when being turned ON, as an indication of thyristor failure.

DESCRIPTION OF THE PREFERRED EMBODIMENT

Figure 1:
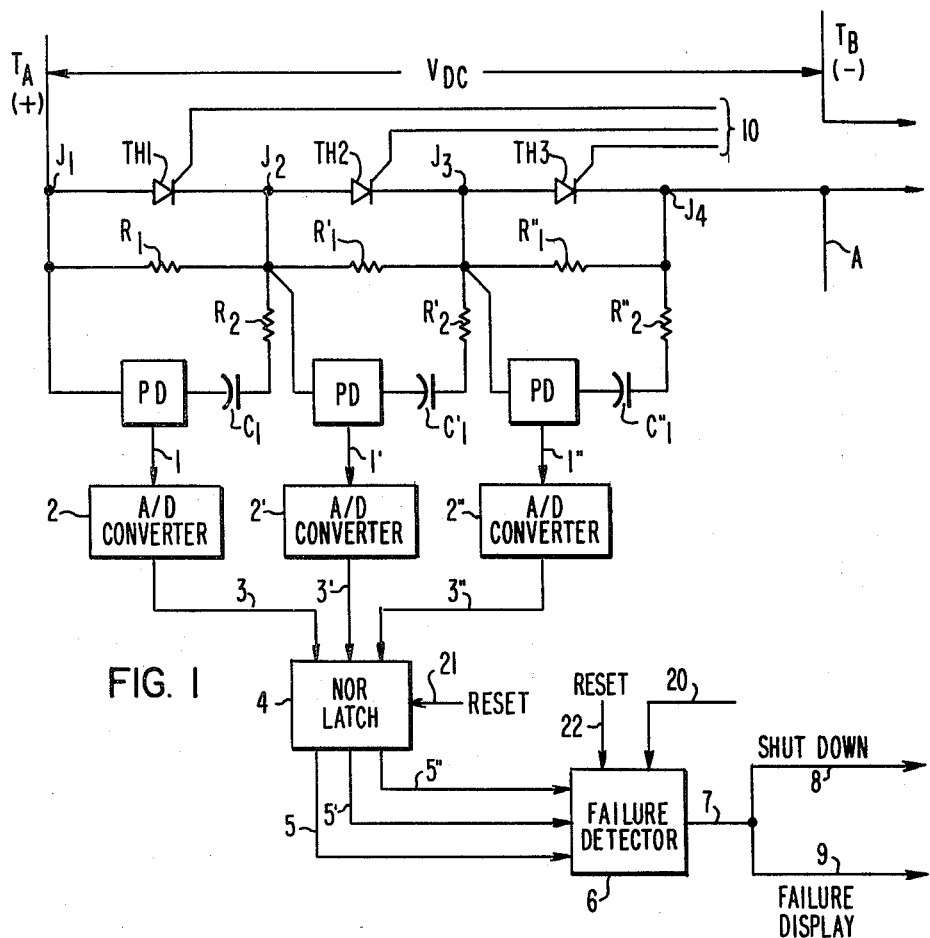
FIG. 1 shows an array of thyristors in series under a common voltage with the provision for thyristor short failure detection according to the invention.

Referring to FIG. 1, between positive terminal $T_A$ of a DC source of voltage $V_{DC}$ applied across opposite DC terminals $T_A$, $T_B$ and an AC phase line A, are connected in series three thyristors $TH_1$, $TH_2$, $TH_3$ belonging to an array of thyristors within a static-controlled converter converting a DC voltage into an AC voltage, applied to three phase lines A, B, C, for instance. The thyristors are gated for conduction from lines 10. The thyristors are turned OFF by natural commutation, e.g. when the voltage between the main electrodes has the appropriate magnitude and polarity. Thyristor $TH_1$ is between nodes $J_1$, $J_2$, thyristor $TH_2$ between nodes $J_2$, $J_3$ and thyristor $TH_3$ between nodes $J_3$ and $J_4$. Resistors $R_1$, $R'_1$, $R''_1$ in parallel with the respective thyristors $TH_1$, $TH_2$, $TH_3$ cause an equal sharing of the voltage supported by the thyristors between line $T_A$ and phase line A.

In accordance with the present invention, a snubber circuit, e.g. a series capacitor-resistor circuit ($R_2$, $C_1$), ($R'_2$, $C'_1$) or ($R''_2$, $C''_1$), is connected in parallel with a corresponding one of thyristors $TH_1$, $TH_2$, $TH_3$, e.g. with resistors $R_1$, $R'_1$, or $R''_1$. When a thyristor is turned OFF, the voltage between the two nodes ($J_1$, $J_2$), ($J_2$, $J_3$) or ($J_3$, $J_4$) is charging the associated snubber circuit. When a thyristor is turned ON, capacitor $C_1$, $C'_1$ or $C''_1$ depending upon whether $TH_1$, $TH_2$ or $TH_3$ is the concurrently gated thyristor, discharges itself through resistor $R_2$, $R'_2$ or $R''_2$ and the now conductive thyristor. A pulse detector PD, PD', PD'' coupled with each snubber circuit, has the capability of detecting the discharge of the associated capacitor when it occurs. By line 1 for capacitor $C_1$, line 1' for capacitor $C'_1$ and line 1'' for capacitor $C''_1$, the detected discharge pulse is converted by an A/D converter into a digital signal which, by lines 3, 3', 3'', is applied to a NOR LATCH device 4. Should, at the moment of gating, one of the thyristors be in a shorted condition, the snubber capacitor will not have been able to charge and the discharge expected upon firing of the thyristor cannot occur. In the absence of a pulse being detected by the corresponding pulse detector PD, PD' or PD'', the digital state of line 3, 3' or 3'' will not be the same as on the other lines, and NOR LATCH device 4, in response to such condition, will change its output state to a ONE on line 5, 5' or 5''. A failure detector 6 is provided which responds to such occurrence by generating an alarm signal on line 7 at its output either to shut down the installation by line 8, or to display the happening of such thyristor failure.

Figure 2:
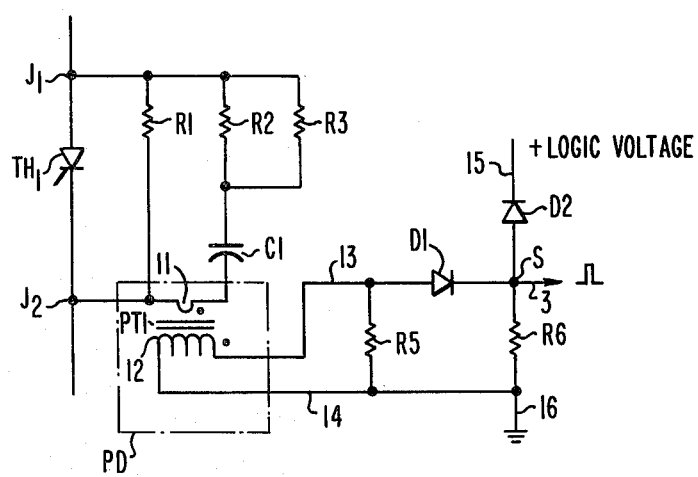
FIG. 2 illustrates the individual thyristor protection circuit of the invention as employed in the circuit of FIG. 1.
Figure 3:
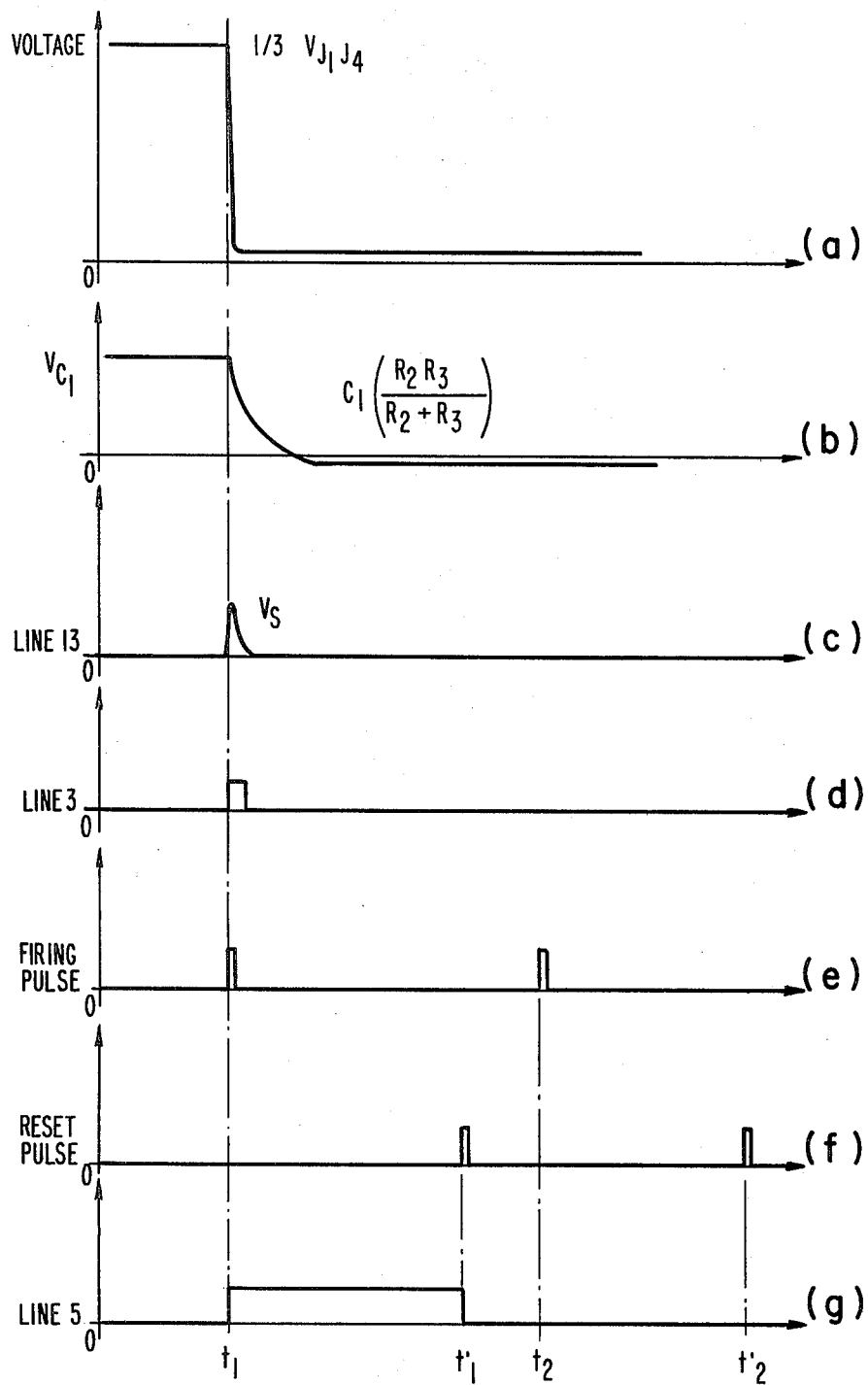
FIG. 3 illustrates with curves the operation of the circuit of FIG. 2.

Referring to FIG. 2, the pulse detector PD is shown to consist, illustratively, in a pulse transformer $PT_1$. An additional resistor $R_3$ is connected in parallel with resistor $R_2$ of the snubber. The snubber network $R_2$, $R_3$ and $C_1$ is calculated in order to limit the rate of rise of the voltage applied to thyristor $TH_1$. In normal operation capacitor $C_1$ charges up in accordance with such applied voltage. When thyristor $TH_1$ is gated, capacitor $C_1$ is discharged over the thyristor and across the primary winding 11 of the pulse transformer $PT_1$. At the secondary side 12, the transformer exhibits a voltage signal $V_S$ of approximately 2 microseconds, as shown in FIG. 3 for illustration by curve (c) in presence of the relaxation curve (b) representing the discharge of capacitor $C_1$ with a time constant $$C_1 \frac{R_2 \times R_3}{R_2 + R_3}$$

If the voltage $V_S$ does not appear, this indicates that thyristor $TH_1$ has failed in the short mode.

FIG. 2 also shows the A/D converter used after pulse detector PD to derive a digital signal characterizing the occurrence of a voltage signal such as $V_S$. The two ends of the secondary winding 12 of pulse transformer $PT_1$ extend over parallel lines 13, 14, line 14 being connected to ground. Across lines 13 and 14 is a resistor $R_5$. The non-grounded line 13 goes into a diode $D_1$ which has its cathode connected to the anode of a steering diode $D_2$ interposed between the positive voltage of the logic circuit and the output line 3. Summing junction S therebetween goes to ground via a resistor $R_6$. $R_5$ has a value of about 1.5 KΩ and $R_6$ amounts to 22 KΩ. The operation of the A/D converter is as follows: when $V_S$ appears on line 13, the voltage on the line reaches a level for which diode $D_1$ is forward biased and becomes conductive. The voltage across resistor $R_6$ raises itself above ground to the point when diode $D_2$ also becomes forward biased, thereby applying the voltage of line 15, namely a logic ONE, to line 3.

Referring again to FIG. 1, when the logic state of lines 3, 3', 3" is a ONE for all lines, NOR LATCH device will establish at its output on lines 5, 5', 5" logic ONES. Should, however, the absence of a voltage $V_S$ on any of the pulse detectors PD manifest itself, at least one of line 3, 3', 3" will be a ZERO, rather than a ONE, and the output state of line 5, 5', or 5" will be a ZERO, rather than a ONE.

Referring to FIG. 3, the overall operation of the circuits of FIGS. 1 and 2 is better understood from a consideration of curves (a) through (g). Up to time $t_1$ thyristor $TH_1$ supports one-third of the voltage applied to the chain of three thyristors $V_{J1,J4}$. Accordingly, capacitor $C_1$ is charged to a voltage $V_{C1}$ (curve (b)). At time $t_1$, when the thyristors are gated by a firing pulse (curve (e)) and thyristor $TH_1$ is turned ON, thyristor $TH_1$ no longer supports $V_{J1,J4}$ as shown by curve (a), whereas capacitor $C_1$ discharges over thyristor $TH_1$ with a time constant of relaxation determined by $$C_1 \frac{R_2 \times R_3}{R_2 + R_3}$$

as shown by curve (b). As a result, pulse transformer $PT_1$ exhibits at its secondary, e.g. on line 13 (FIG. 2) a voltage signal $V_S$ (see curve (c)). Consequently A/D converter 2 changes state at its output (line 3) as evidenced by the logic state of curve (d). Later in the cycle, the circuits are reset, namely the NOR LATCH device 4 by line 21 and the failure detector 6 by line 22, as evidenced at time $t_i$ on curve (f).

At time $t_2$, when a second firing pulse (curve (e)) has been applied to the thyristors, thyristor $TH_1$ is assumed to be shorted as evidenced by the absence of a pulse $V_S$ (curve (c)) since there has been no build-up to the voltage $\frac{1}{3}V_{J1,J4}$, nor any correlative charging to $V_{C1}$ (curve (b)) on the snubber capacitor $C_1$. Now the NOR LATCH device will change state as evidenced by curve (g). The NOR device is reset at time $t'_2$ by the reset pulse of line 21, as evidenced by curves (f).

Two other conditions, other than a shorted thyristor might happen which will prevent a signal $V_S$ on line 1 from being translated by A/D converter 2 into the normal logic ONE on line 3, 3' or 3". One such condition occurs when the thyristor has failed in the open mode. In this case the thyristor fails to be turned ON. Therefore, the snubber circuit is not being discharged upon gating. However, such failure is only temporary and in all likelihood upon the next half-cycle, gating will cause the thyristor to be turned ON normally. Therefore, despite such apparent absence of snubber discharge at one gating instant, this failed-open condition should not be taken for a shorted mode failure. In order to prevent a false alarm on line 7, the failure detector is conditioned so that on such occurrence the failure will be ignored. One way of doing this is to require a repeated occurrence of a critical logic state on line 7 before lines 8 and 9 are being activated.

Another false shorted failure condition occurs when the thyristor is gated at very low gating angles. In such case, capacitor $C_1$ is unable to reach a potential high enough to provide the amount of charge required to produce upon being discharged a signal $V_S$ of sufficient magnitude. Diode $D_1$ would not be forward biased and no change of state will appear at summing point S, e.g. on line 3. This situation is avoided by causing the failure detector 6 to be disabled automatically by line 20 whenever the thyristor gating circuit has been adjusted for low gating angles.

We claim:
1. In an array of thyristors serially connected and sharing a voltage common to said array, the thyristors being controlled independently and selectively for conduction by natural commutation under said common voltage, the provision of:
   a plurality of capacitor means each associated individually with a corresponding one of said thyristors, said capacitor means being adapted to be charged under said common voltage when the associated thyristor is non-conductive, and adapted to be discharged through the associated thyristor when the latter is turned ON;
   a like plurality of means responsive to a discharge condition of a corresponding one of said capacitor means for generating a representative pulse; and
   means responsive to the respective said representative pulses for detecting the absence of at least one of said representative pulses as an indication of thyristor failure under a shorted condition in one of the thyristors of said array.
2. The thyristor array of claim 1, with said detecting means being digital in nature.
3. The thyristor array of claim 2, with each said representative pulse generating means being a pulse transformer having a primary for passing the discharge of the associated capacitor means, and a secondary for generating a corresponding voltage signal;
   said digital detecting means including a plurality of A/D converters each associated with a corresponding one of said transformer secondaries;
   a NOR device coupled to all of said A/D converters; and
   means being provided responsive to said NOR device when said NOR device is in a critical condition indicative of a short thyristor failure for indicating such critical condition.

* * * * *